United States Patent
Noguchi et al.

(10) Patent No.: US 6,740,455 B2
(45) Date of Patent: May 25, 2004

(54) PHOTOMASK

(75) Inventors: Kenji Noguchi, Tokyo (JP); Toshiaki Motonaga, Tokyo (JP); Hiro-o Nakagawa, Tokyo (JP); Yasutaka Morikawa, Tokyo (JP); Toshifumi Yokoyama, Tokyo (JP); Takashi Tominaga, Tokyo (JP); Yoshinori Kinase, Tokyo (JP); Junji Fujikawa, Tokyo (JP); Yoichi Takahashi, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 157 days.

(21) Appl. No.: 10/023,841

(22) Filed: Dec. 21, 2001

(65) Prior Publication Data

US 2002/0119379 A1 Aug. 29, 2002

(30) Foreign Application Priority Data

Dec. 22, 2000 (JP) ........................................ 2000-390382

(51) Int. Cl.$^7$ .................................................. G03F 9/00
(52) U.S. Cl. ............................................................ 430/5
(58) Field of Search ........................ 430/5, 322; 428/469, 428/472

(56) References Cited

U.S. PATENT DOCUMENTS 4,440,841 A * 4/1984 Tabuchi ........................ 430/5

* cited by examiner

Primary Examiner—S. Rosasco
(74) Attorney, Agent, or Firm—Rader, Fishman & Grauer PLLC

(57) ABSTRACT

A photomask is produced which enables the simplification of the steps of lithography. A photomask is provided with shielding patterns made of shielding metallic thin film on a transparent substrate, wherein the photomask further comprises translucent patterns mainly including tantalum of materials selected from tantalum silicide, tantalum oxide, tantalum nitride or mixture thereof.

3 Claims, 5 Drawing Sheets

FIG.3
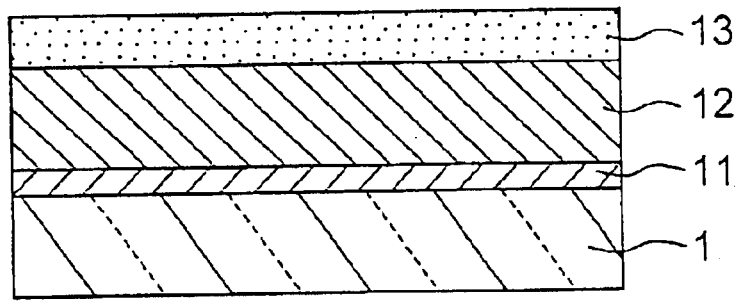
FIG. 3 (a)
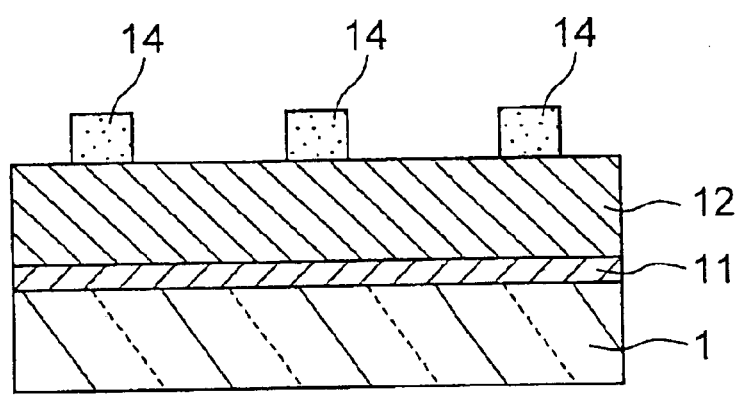
FIG. 3 (b)
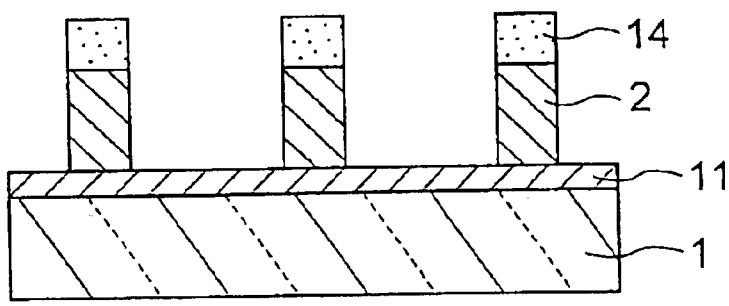
FIG. 3 (c)

FIG.4
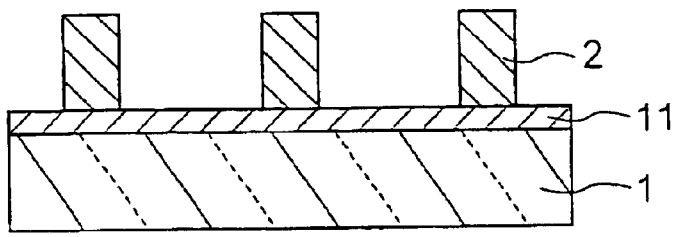
FIG. 4 (a)
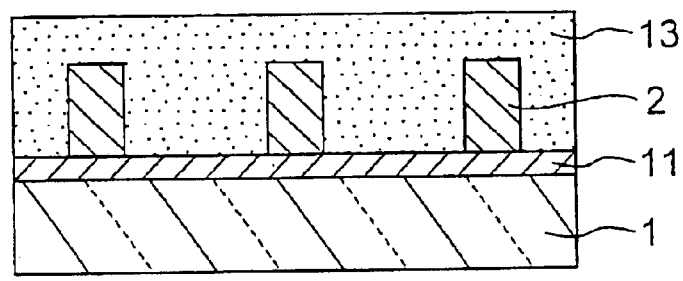
FIG. 4 (b)
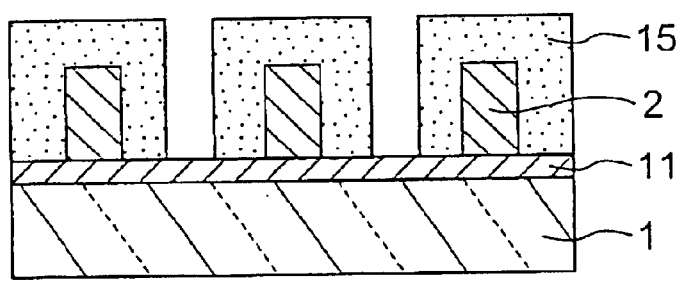
FIG. 4 (c)
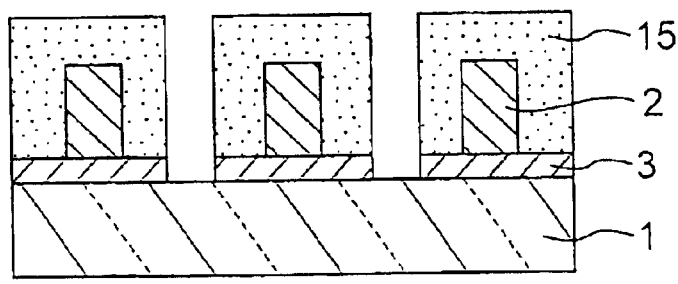
FIG. 4 (d)

FIG.5
FIG. 5 (a)
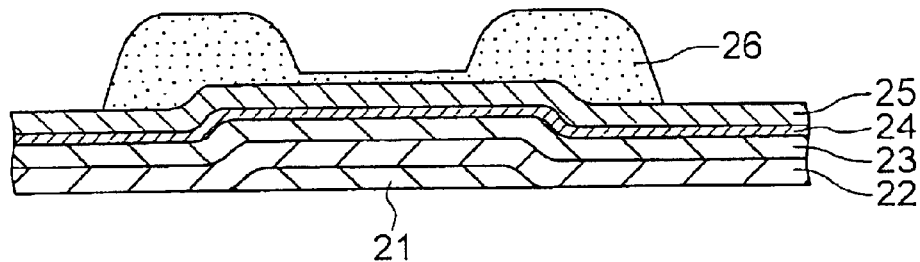
FIG. 5 (b)
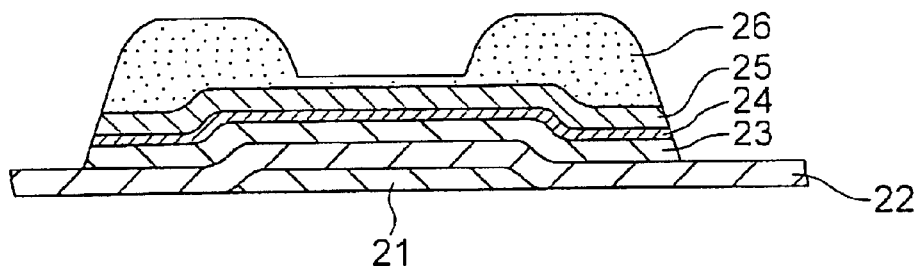
FIG. 5 (c)
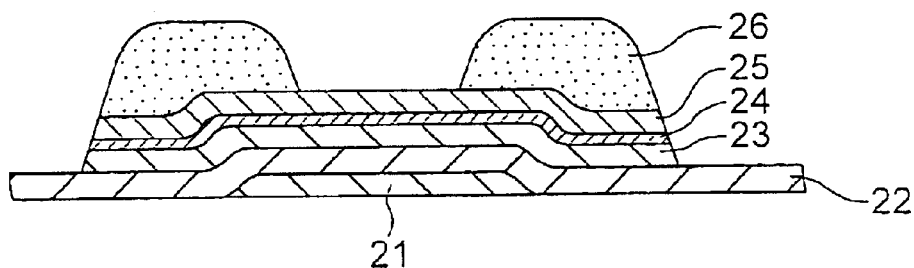

FIG.6
FIG. 6 (a)
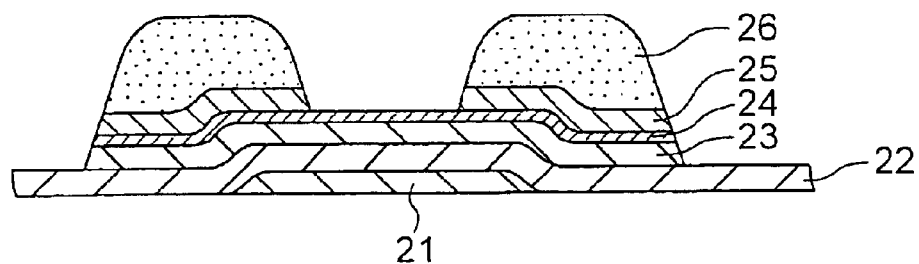
FIG. 6 (b)
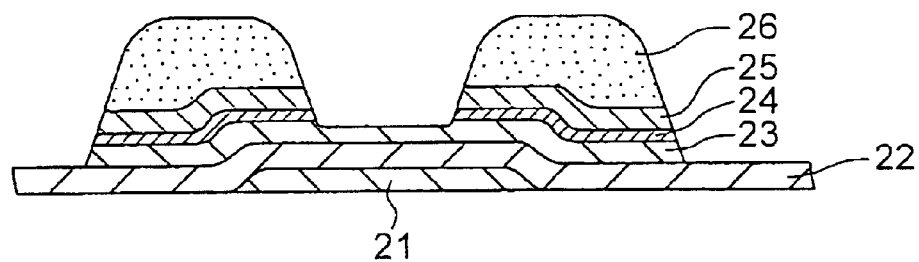
FIG. 6 (c)
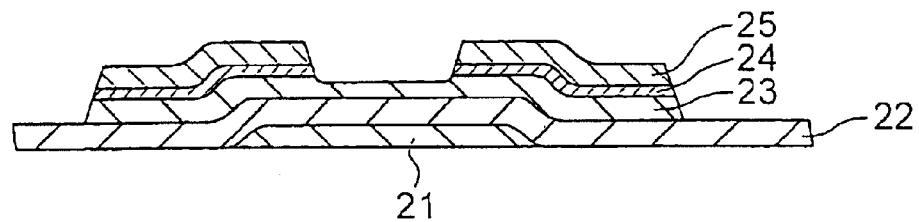

PHOTOMASK

BACKGROUND OF THE INVENTION

1. Field of the Invention

The present invention relates to a photomask.

2. Related Art

In a process for producing a semiconductor device a display and others, patterns written on a photomask are transferred to a wafer, a substrate of display panel, and others. Namely, the steps for transferring patterns of a photomask to a wafer, a substrate of display panel, and others, are carried out beginning from an application of a photo resist onto a wafer, a base of display panel, and others; carrying out a demagnification projection by means of a stepper; developing the photo resist to form a mask; and etching a liner or under a film through a photo resist as a mask and thereafter removing unnecessary areas of the photo resist.

It is said that large-scaled amorphous silicon TFT and LCD devices used as the display of a notebook personal computer and a desktop personal computer, are produced through five to six of steps of patterning made by photo etching a substrate of the TFT. Therefore, it is required that these steps of photolithography are simplified to reduce the cost of production.

However, there is a limit in the simplification of steps of photolithography in a conventional system for transferring patterns to a wafer and others, by transmitting or shielding projected light through shielding patterns on a photomask, when the shielding patterns are present or not.

SUMMARY OF THE INVENTION

It is an object of the present invention to provide a photomask that enables the simplification of steps of photolithography.

Inventors made a study in order to attain the above-mentioned object. As a result, inventors found that projecting a number of rays to a wafer based on the area becomes possible through a conventional photomask having shielding pattern films made of shielding metallic thin film formed on a transparent substrate. The photomask is further provided with translucent patterns made of translucent metallic thin film including mainly tantalum. The tantalum is made from materials selected from tantalum silicide, tantalum oxide, tantalum nitride or a mixture thereof. The steps of projection and development made using the photomask bring about a difference in solubility between a part of resist corresponding to shielding patterns and a part of a resist corresponding to translucent patterns by which a resist pattern comprised of a portion of patterns having the thickness of resist patterns formed ordinarily and a portion of thinner patterns can be formed. It is then possible to make two species of patterning in one photomask so that the reduction of the number of masks is realized. The inventors made the present invention based on the basis of the above-mentioned knowledge.

Namely, the present invention, as mentioned in claim 1, is a photomask provided with shielding patterns made of shielding metallic thin film on a transparent substrate, wherein the photomask further comprises translucent patterns mainly including tantalum of materials selected from tantalum silicide, tantalum oxide, tantalum nitride or mixture thereof.

Layers formed on an insulating substrate, according to the present invention, can be formed into patterns through the steps of overlaying the layers with a resist pattern comprised of a part of patterns having the thickness of resist pattern formed ordinarily and a part of patterns made of thin film, etching the layers through the resist pattern so that the layers are formed into patterns, thereafter removing the part of patterns made of thin film by $O_2$ ashing and the like so that a part of the layer covered with the part of patterns made of thin film is exposed, and further etching a part of the exposed layer by which the number of steps of photolithography can be reduced.

BRIEF DESCRIPTION OF THE DRAWINGS

FIG. 3 is a sectional view for illustrating the steps of production of a photomask of the present invention.

FIG. 4 is a sectional view for illustrating the steps of production of a photomask of the present invention made following the steps of production of a photomask shown in FIG. 3.

FIG. 5 is a sectional view showing the steps of patterning made using a photomask of the present invention.

FIG. 6 is a sectional view showing the steps of patterning made using a photomask following the steps of patterning shown in FIG. 5.

PREFERRED EMBODIMENT OF THE INVENTION

Figure 1:
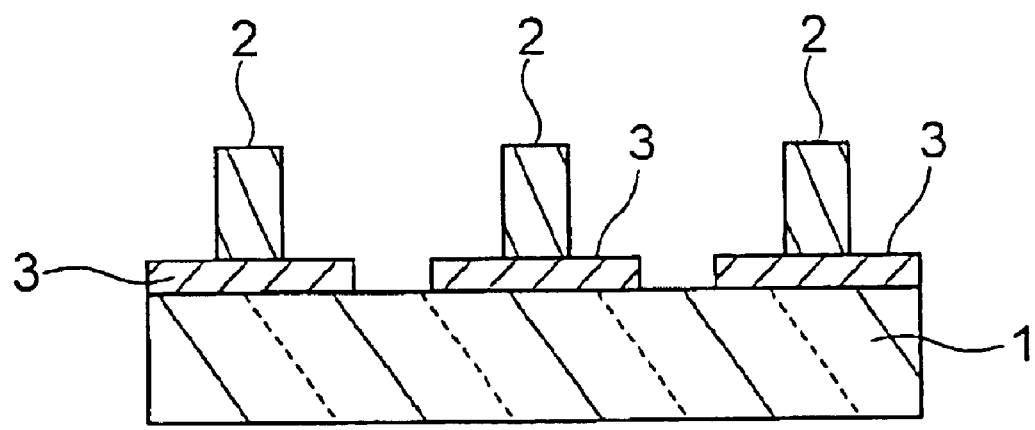
FIG. 1 is a schematic sectional view of a photomask of the present invention.

FIG. 1 shows conceptually the structure of photomask of the present invention. A photomask of the present invention comprises a transparent substrate 1a and shielding patterns 2 made of shielding metallic thin film wherein the photomask further comprises translucent patterns 3 made of translucent metallic thin film mainly including tantalum of materials selected from tantalum silicide, tantalum oxide, tantalum nitride or mixture thereof.

In a photomask of the present invention, optically transparent materials such as soda-lime glass, quartz glass, and sapphire can be used as the transparent substrate.

Further, materials such as Cr, $Cr_2O_3$, and Si can be used as a shielding metallic thin film for forming shielding patterns.

Intermediate layer such as $SiO_2$ can be provided between a shielding metallic thin film and a translucent metallic thin film. The intermediate layer prevents translucent metallic thin film from being damaged by over-etching when etching the shielding metallic thin film. In the present invention, the reason that translucent patterns are made of materials mainly including tantalum is because materials mainly including tantalum are the most suitable materials that not only make easy the adjustment of optical amounts with the adjustment of thickness, but also have excellent workability and durability.

The translucence of translucent patterns can be adjusted according to the thickness of the translucent metallic thin film. Further, the adjustment of the translucence of translucent patterns can be possible in the following method: a plurality of openings having size under a resolution of limit of an aligner are formed in a translucent metallic thin film such that writing is not possible by light passing through the openings so that amounts of applied rays to the whole of translucent pattern is lacking for exposure.

Figure 2:
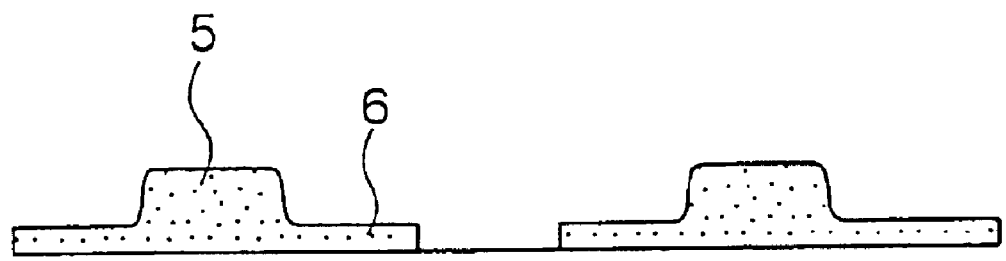
FIG. 2 is a sectional view of resist pattern formed using a photomask of the present invention.

FIG. 2 shows schematically a resist pattern made using a photomask of the present invention. Exposure and development made using a photomask of the present invention produces a difference in solubility of exposed material against developing a solution between a part of a resist corresponding to shielding patterns 2 and a part of the resist corresponding to the translucent patterns 3. Accordingly, a resist pattern comprised of a part 5 of patterns having the thickness of the resist pattern formed ordinarily and a part 6 of patterns made of thin film is formed. (In FIG. 2, a photomask is shown with enlarging crosswise a photomask against a photomask shown in FIG. 1 to be easy to be seen.)

Then, referring to FIGS. 3 and 4, a method for producing a photomask of the present invention is explained. First, a blank is provided in which the translucent metallic thin film 11 mainly including tantalum of materials selected from tantalum silicide, tantalum oxide, tantalum nitride, or a mixture thereof and the shielding metallic thin film 12 made of materials such as Cr and further the resist 13 is applied on the shielding metallic thin film 12 as shown FIG. 3(a).

Then, a resist pattern 14 for forming shielding patterns is formed by carrying out a first writing and development as shown in FIG. 3(b).

Then, the shielding metallic thin film 12 is etched by wet etching or dry etching so that the shielding patterns 2 is formed as shown in FIG. 3(c).

Then, the resist patterns 14 are removed as shown in FIG. 4(a). Thereafter, then resist 13 is again applied on the translucent metallic thin film 11 and the shielding patterns 2 as shown in FIG. 4(b). Then, a second writing and development are carried out so that resist patterns 15 for forming translucent patterns are formed as shown in FIG. 4(c).

Then, the translucent metallic thin film 11 is etched by dry etching or wet etching so that the translucent patterns 3 are formed as shown in FIG. 4(d).

Finally, a photomask can be obtained by removing the resist 13 as shown in FIG. 1.

Then, referring to FIGS. 5 and 6, an example of application of a photomask of the present invention is explained.

First, as shown in FIG. 5(a), a gate line 21 is formed on an insulating substrate (not shown) thereby laminating metallic materials such as Al/Mo in the same manner as a conventional method. Then, SiNx film 22 and a.Si film (amorphous silicon film) 23, $N^+$ a.Si film ($N^+$ amorphous silicon film)24 are laminated on an insulating substrate provided with the gate line 21. Further, a film 25 of materials such as a Cr/Mo and Ti/M is laminated on the $N^+$ a.Si film 24. Thereafter, a resist pattern 26 covering a source electrode, a drain electrode and a channel portion is formed using a photomask of the present invention.

Then, a part of the source electrode, drain electrode and pixel electrode and others uncovered by the resist pattern 26 is removed by etching (refer to FIG. 5(b)).

Then, a part of the resist pattern 26 thinly formed covering the channel portion is removed by $O_2$ ashing (refer to FIG. 5(c)).

Then, a part of film 25 made of materials such as Cr/Mo, Ti/M, and a $N^+$ a.Si film (N+ amorphous silicon film)24 corresponding to the channel portion is removed by etching and, the resist pattern 26 is removed (refer to FIGS. 6(a)~(c)).

Thereafter, a film of passivation dielectrics is formed so that TFT is obtained.

As mentioned hereinabove, according to the present invention, two species of patterning can be carried out in one mask.

Then, an example of a photomask of the present invention is given.

EXAMPLE

First, a glass polished on double sides with a size of 6 inch×6 inch and thickness of 0.12 inch is provided. After washing of the glass, a tantalum layer with thickness of 200 angstrom and transmittance against rays of wavelength 436 nm more than 20% is formed by carrying out a spattering process under the following conditions.

Spattering Conditions:
 (Magnetron Spatter)
 DC magnetron
 A use of metallic tantalum target
 Argon gas 50 sccm
 Pressure: 0.3 Pa
 Current: 3 ampere Then, a layer of $SiO_2$ with a thickness of 500 angstrom is formed by carrying out a spattering process under the following conditions.

Spattering Conditions:
 (Magnetron Spatter)
 RF magnetron
 A use of $SiO_2$ target
 Argon gas 50 sccm
 Pressure: 0.1 Pa
 Electric power: 1 kilowatt Then, double layers of chromium are formed on the layer of $SiO_2$ carrying out a spattering process under the following conditions.

Spattering Conditions:
 (Magnetron Spatter)
 A use of metallic chromium target
First Layer
 Argon gas 50 sccm
 Pressure: 0.3 Pa
 Current: 0.3 ampere
 Thickness: 800 angstrom
Second Layer
 Argon 30 sccm+Oxygen 70 sccm
 Pressure: 0.3 Pa
 Current: 2 ampere
 Thickness: 200 angstrom Further, a resist is applied on the double layers of chromium by a conventional spin coating method, thereafter writing and developing are carried out by an electron beam lithography method to form a resist pattern for forming shielding patterns.

Then, the chromium layer and the $SiO_2$ layer are etched through the resist pattern under the following conditions to form shielding patterns.

Etching Conditions:
 A use of dry etching equipment (VLR manufactured by UNAXIS Inc.) (Etching of chromium)

| | |
|---|---|
| Etching gas | $Cl_2 + O_2$ gas (the ratio of 2:3) |
| Pressure | 10 mTorr |
| ICP power (Power for generating a high-density plasma) | 500 W |
| Bias power (Power for extracting plasma to the side of the substrate) | 25 W |
| Time required for etching | 360 seconds |

-continued

| | |
|---|---|
| (Etching of SiO$_2$ layer | |
| Etching gas | CF$_4$ gas |
| Pressure | 100 mTorr |
| ICP power | 950 W |
| (Power for generating a high-density plasma) | |
| Bias power | 50 W |
| (Power for extracting plasma to the side of the substrate) | |
| Time required for etching | 30 seconds |

Then, after the resist is removed, rinsing was carried out. Thereafter, the resist is applied on the formed shielding patterns and alignment writing and development are carried out by a conventional electron beam lithography, so that a resist pattern for forming the translucent patterns is formed. Thereafter, dry etching is carried out under the following conditions to form translucent patterns.
Etching Conditions:
  A use of dry etching equipment (VLR manufactured by UNAXIS Inc.)

| | |
|---|---|
| Etching gas | Cl$_2$ gas |
| Pressure | 100 mTorr |
| ICP power | 500 W |
| (Power for generating a high-density plasma) | |
| Bias power | 25 W |
| (Power for extracting plasma to the side of the substrate) | |
| Time required for etching | 30 seconds |

Thereafter, the resist was removed and rinsing is carried out, so that a photomask of the present invention is obtained.

As mentioned hereinabove, a photomask of the present invention is a photomask provided with shielding patterns made of shielding metallic thin film on a transparent substrate, wherein the photomask further comprises translucent patterns mainly including tantalum of materials selected from tantalum silicide, tantalum oxide, tantalum nitride or mixture thereof. Therefore, the photomask of the present invention enables the formation of a resist pattern comprised of a portion of patterns having the thickness of resist patterns formed ordinarily. Accordingly, the photomask of the present invention allows two species of patterning to be made in one mask, so that the steps of photolithography can be reduced. Accordingly, work of patterning made by means of photomask can be carried out with low cost and high throughput.

What is claimed is:
1. A photomask provided with shielding patterns made of shielding metallic thin film on a transparent substrate, wherein the photomask further comprises translucent patterns mainly including tantalum of materials selected from tantalum silicide, tantalum oxide, tantalum nitride or a mixture thereof.
2. A photomask as claimed in claim 1, wherein an intermediate layer is provided between translucent pattern layer and shielding pattern layer.
3. A photomask as claimed in claim 2, wherein the intermediate layer is made of silicon oxide.

* * * * *